United States Patent

Yu et al.

[11] Patent Number: 6,162,716
[45] Date of Patent: Dec. 19, 2000

[54] AMORPHOUS SILICON GATE WITH MISMATCHED GRAIN-BOUNDARY MICROSTRUCTURE

[75] Inventors: Chen-Hua Yu, Hsin-chu; Jih-Churng Twu, Chung Ho, both of Taiwan

[73] Assignee: Taiwan Semiconductor Manufacturing Company, Hsin-Chu, Taiwan

[21] Appl. No.: 09/277,561

[22] Filed: Mar. 26, 1999

[51] Int. Cl.[7] ............................................... H01L 21/3205
[52] U.S. Cl. ........................ 438/592; 438/305; 438/585; 438/935; 438/283
[58] Field of Search .................. 438/592, 585, 438/588, 305, 935, 283

[56] References Cited

U.S. PATENT DOCUMENTS

| | | | |
|---|---|---|---|
| 4,479,831 | 10/1984 | Sandow et al. | 148/1.5 |
| 4,597,159 | 7/1986 | Usami et al. | 29/571 |
| 4,789,883 | 12/1988 | Cox et al. | 357/23.7 |
| 4,797,108 | 1/1989 | Crowther | 437/41 |
| 5,393,687 | 2/1995 | Liang | 437/46 |
| 5,482,895 | 1/1996 | Hayashi et al. | 437/200 |
| 5,510,278 | 4/1996 | Nguyen et al. | 437/40 |
| 5,518,958 | 5/1996 | Giewont et al. | 437/186 |
| 5,652,156 | 7/1997 | Liao et al. | 437/40 |
| 5,767,004 | 6/1998 | Balasubramanian et al. | 438/592 |
| 5,972,761 | 10/1999 | Wu | 438/305 |

*Primary Examiner*—Savitri Mulpuri
*Assistant Examiner*—Viktor Simkovic
*Attorney, Agent, or Firm*—George O. Saile; Stephen B. Ackerman; William J. Stoffel

[57] ABSTRACT

A method of forming an amorphous-Si ($\alpha$-Si) gate with two or more $\alpha$-Si layers with mismatched grains. The first embodiment involves forming two or more amorphous silicon layers over the gate dielectric. The amorphous silicon layers are formed insitu (in a reactor chamber without removing the wafer from the chamber). An amorphous silicon layer is deposited by exposing the substrate to a Silicon containing gas (E.g., $SiH_4$). The Si containing gas flow is stopped. The chamber is pumped down and back filled with an inert gas to remove said silicon containing gas. In the next insitu step, the Si containing gas is restarted thus depositing the next amorphous Si layer. This deposition and purge cycle is repeated the desired number of times to form two or more mismatched $\alpha$-Si layers. In the second embodiment, after an $\alpha$-Si layer is deposited, the wafer is etched, for example in an HF vapor or wet clean. Then the wafer is returned to the chamber and another $\alpha$-Si layer is formed thereover. The multi-layered $\alpha$-Si gate is patterned and conventional processing completes the FET device. The $\alpha$-Si gate prevents ion channeling to the gate dielectric.

15 Claims, 2 Drawing Sheets

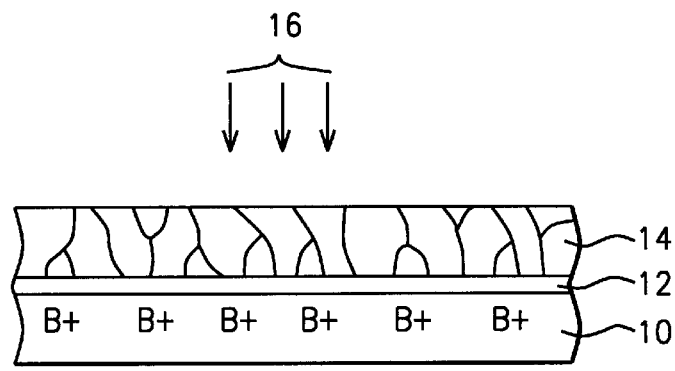
*FIG. 1 - Prior Art*
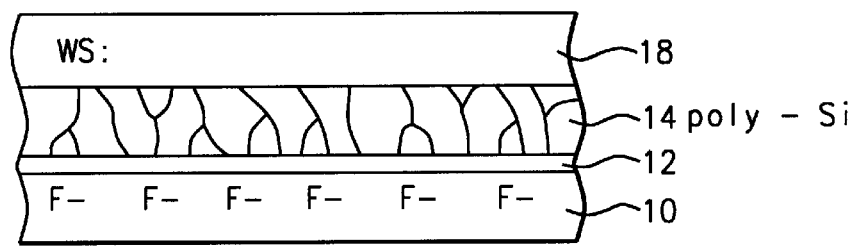
*FIG. 2 - Prior Art*
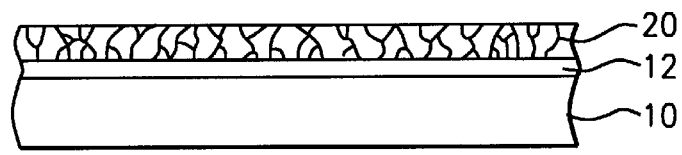
*FIG. 3*

AMORPHOUS SILICON GATE WITH MISMATCHED GRAIN-BOUNDARY MICROSTRUCTURE

BACKGROUND OF INVENTION

1) Field of the Invention

The invention relates to the fabrication of integrated circuit devices, and more particularly, to a method of forming an multi-layered α-Silicon gate structure which inhibits the penetration of ions into the underlying gate oxide in the fabrication of integrated circuits.

2) Description of the Prior Art

In the fabrication of semiconductor integrated circuits, it is a conventional process to use a polysilicon gate. The polysilicon is grown at a temperature of about 620° C. until the desired thickness is reached. Since the temperature is held constant throughout the growth of the polysilicon, the polysilicon grains will be column-like. FIGS. 1 and 2 illustrate a partially completed integrated circuit of the prior art in which a layer of silicon oxide 12 has been grown on a semiconductor substrate. Polysilicon layer 14 has been grown at a constant temperature of 620° C., as described above.

Below the ion channel is explained. In FIG. 1, when B+ or $BF_{2+}$ ions are implanted 16 into the polysilicon layer 14, the B+ ions easily diffuse through the column-like grain boundaries of the polysilicon into the gate oxide layer 12. $BF_2$ implanted into the gate during P+ S/D I/I and annealed. Similarly, in FIG. 2, when the polysilicon layer 14 is capped with a tungsten silicide film 18, F− ions (from reactants e.g., $WF_6$) easily diffuse through the column-like grain boundaries of the polysilicon into the gate oxide layer 12. As a consequence of this diffusion, the gate oxide effective thickness will be increased. Also, especially in the case illustrated by FIG. 2, electron traps are created within the gate oxide layer. The B+ penetration will cause threshold voltage shift causing device and circuit failure.

The present invention uses a multiple layer amorphous silicon (α-Si) gate with mismatched grain boundaries to confine the ions within the amorphous silicon (a-Si) and inhibit the penetration of the ions into the underlying gate oxide.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,518,958 (Giewont) shows a method of forming a Nitrogen—enriched doped polysilicon layer.

U.S. Pat. No. 5,482,895 (Hayashi) shows a method for forming a silicide electrode.

U.S. Pat. No. 4,797,108 (Crowther) shows an a-Si FET and implanting into the gate.

U.S. Pat. No. 4,789,883 (Cox et al.) shows an a-Si floating gate that is I/I with n-type impurities.

U.S. Pat. No. 4,597,159 (Usami) shows a method of forming a EEPROM having an a-Si gate.

U.S. Pat. No. 4,479,83 (Sandow) shows a gate formed using an a-Si layer that is annealed.

U.S. Pat. No. 5,652,156 (Liao et al.) shows a polysilicon deposition method for a gate.

SUMMARY OF THE INVENTION

A principal object of the present invention is to provide a method of forming a polysilicon gate which inhibits penetration of ions through the polysilicon gate to the underlying gate oxide layer.

An object of the present invention is to provide an insitu process for forming a multiple layered α-Si gate using $N_2$ purges between α-Si deposition steps.

An object of the present invention is to provide a process for forming a multiple layered α-Si gate by depositing an α-Si layer, etching the α-Si layer and depositing another α-Si layer thereover where the etch makes the grains more misaligned.

To accomplish the above objectives, the invention discloses a method of forming an amorphous-Si gate (α-Si ) with 2 or more α-Si layers with mismatched grain. The invention has two preferred embodiments for forming the multi-layered α-Si gate.

The first embodiment begins by providing a gate dielectric layer over a substrate; placing the substrate in a chamber of a reactor. We form a first amorphous silicon layer over the gate dielectric layer. In a key step, the chamber is flushed with an inert gas to remove the Si containing gas. Then a second amorphous silicon layer is deposited over the first amorphous silicon layer; wherein the silicon grain boundaries of the first and the second amorphous silicon layer are mismatched. We next remove the substrate from the chamber. Te mismatched silicon grain boundaries inhibit the penetration of ions into the gate silicon oxide layer underlying the gate.

The second embodiment begins by forming a gate dielectric layer over a substrate. A first amorphous silicon layer is formed over the gate dielectric layer. In a key step, the first amorphous silicon layer is etched. We deposit a second amorphous silicon layer over the first amorphous silicon layer; wherein the silicon grain boundaries of the first and the second amorphous silicon layer are mismatched. Then the amorphous silicon layers are patterned to form a multi-layered amorphous gate.

The preferred embodiments are described in more detail below.

The first embodiment involves forming in-situ two or more amorphous silicon layers (e.g., 20 22 24 26) by stopping the Si reactant gas flow and back filling the reactor with an inert gas. The amorphous silicon layers are formed insitu (in a reactor chamber without removing the wafer from the chamber). An amorphous silicon layer is deposited by exposing the substrate to a Silicon containing gas (E.g., $SiH_4$) at a temperature between 500 and 550° C. The Si containing gas flow is stopped, and between said amorphous silicon layers, the chamber is pumped down and back filled with an inert gas to remove said silicon containing gas. It is important to understand that this purge of Si containing gas is not an anneal step because the α-Si does not change structure and the temperatures and times are not high enough to transform the α-Si structure. In the next step, the Si containing gas is restarted thus depositing the next amorphous Si layer.

In the second embodiment, after an α-Si is deposited, the wafer is etched, for example in an HF vapor or wet clean. Then the wafer is returned to the chamber and another α-Si layer is formed thereover.

After the formation of the multi-layered α-Si gate normal processing occurs. For example, ions are implanted into the gate to dope the gate. The mis-matched α-Si grain boundaries prevent these ions from channeling to the gate oxide.

The invention provides the following benefits.

The invention provides two embodiments for forming mismatched α-Si grain layers that block ion channeling in gates.

The first embodiment forms the α-Si insitu which saves time and is an efficient manufacturing process.

The multiple α-Si layered gate is superior to multiple layered polysilicon gates.

The multiple α-Si layered gate is superior to single α-Si layer gates. See U.S. Pat. No. 4,789,883 (Cox).

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 and 2 schematically illustrate in cross-sectional representation a process of the prior art.

FIGS. 3, 4 and 5 are cross sectional views, for illustrating embodiments for method for manufacturing a multi-layered α-Si gate of a semiconductor device according to the present invention.

DETAILED DESCRIPTION OF THE PREFERRED EMBODIMENTS

Figure 4:
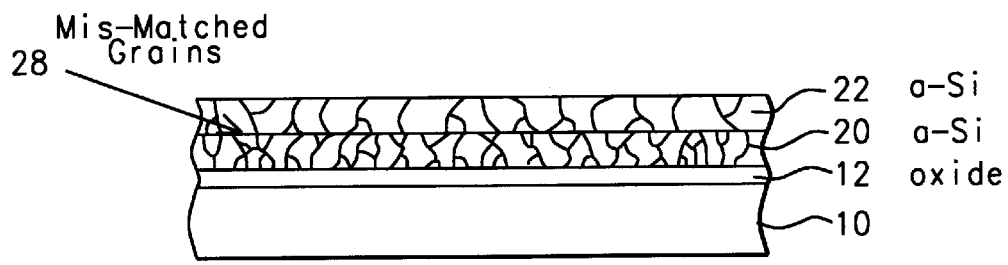
Figure 5:
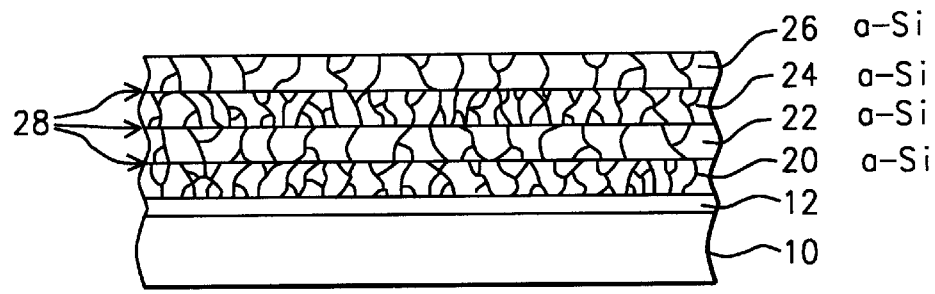

The present invention will be described in detail with reference to the accompanying drawings. The present invention provides a method of forming a multiple layered α-Si gate where the α-Si grains layers are mis-match 28. E.g., See FIG. 4.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not been described in detail in order to not unnecessarily obscure the present invention.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

A. "Ion Channeling Problem" that the Invention Solves

The inventors have found that conventional polysilicon gates, even multiple layered polysilicon gates, suffer local ion-channeling through the grain boundaries. During dual gate or symmetric gate CMOS processes, the gate is ion implanted with of N+ and P+ impurities. The inventors have found that during gate implantation, local ion channeling can occur through the gate grain boundaries if we have polysilicon micro structure.

The local ion channeling may create gate oxide integrity problems, such as gate leakage is high, $V_{bd}$ is low.

The inventors have found that the local ion channeling creates the $V_{bd}$ tailing curve accumulative fail test problem.

B. Overview of the Invention

The first embodiment involves forming in-situ two or more amorphous silicon layers (e.g., 20 22 24 26—See FIG. 6) by stopping the Si reactant gas flow and back filling the reactor with an inert gas. The amorphous silicon layers are formed insitu (in a reactor chamber without removing the wafer from the chamber). An amorphous silicon layer is deposited by exposing the substrate to a Silicon containing gas (E.g., $SiH_4$) at a temperature between 500 and 550° C. The Si containing gas flow is stopped, and between said amorphous silicon layers, the chamber is pumped down and back filled with an inert gas to remove said silicon containing gas. It is important to understand that this purge of Si containing gas is not an anneal step because the α-Si does not change structure and the temperatures and times are not high enough to transform the α-Si structure. In the next step, the Si containing gas is restarted thus depositing the next amorphous Si layer.

In the second embodiment, after an α-Si is deposited, the wafer is etched, for example in an HF vapor or wet clean. Then the wafer is returned to the chamber and another α-Si layer is formed thereover.

After the formation of the multi-layered a-Si gate normal processing occurs. For example, ions are implanted into the gate to dope the gate. The mis-matched (α-Si grain boundaries prevent these ions from channeling to the gate oxide.

C. Detailed Description of Preferred Embodiments

Referring now more particularly to FIG. 3, there is shown an illustration of a partially completed integrated circuit. The semiconductor substrate 10 is preferably composed of silicon having a (100) crystallographic orientation. A gate dielectric is then formed. The gate dielectric layer can be formed of oxide, oxynitride or nitride and other materials as technology evolves. The surface of the silicon substrate 10 is preferably thermally oxidized to form the desired gate silicon oxide layer 12 thickness. The preferred thickness is between about 60 to 140 Angstroms.

Referring to FIGS. 3 and 4, a multi-layered α-Si gate is formed over the gate oxide layer. Preferably, two α-Si layers are formed and most preferably two or more α-Si layers are formed.

D. 1st Embodiment—From a Multiple α-Si Layered Gate by Stopping the α-Si Deposition and Purging the Reactor The first embodiment involves forming two or more amorphous silicon layers (e.g., 20 22 24 26) over the gate oxide 12. E.g., see FIG. 6. The amorphous silicon layers are formed insitu (in a reactor chamber without removing the wafer from the chamber). A key feature is that the Si reactant gas is stopped and the chamber purged between α-Si layer deposition steps.

The first embodiment starts by placing the substrate in a chamber of a reactor and sequentially performing the following steps.

A first amorphous silicon layer 20 is deposited over the gate oxide layer 12. The first amorphous silicon layer 20 is preferably grown at temperature between about 510 and 560° C. using a Si containing gas such as $SiH_4$, or $Si_2H_6$ (dichlorosilane) and most preferably $SiH_4$. The first amorphous silicon layer having a thickness in a range of between about 300 and 1000 Å. The first amorphous silicon layer is undoped.

Silicon deposited between 500 and 550° C. forms α-Si. In contrast Silicon deposited at temperature greater than 600° C. form polysilicon. In the patent, all α-Si layers (e.g., 20 22 etc.) are deposited between 500 and 550° C.

Next, in a key step, the wafer remains insitu, the Si reactant gas is turned off and the chamber is flushed with an inert gas, such as $N_2$ or Ar or vacuum (no gas flow) and most preferably $N_2$ gas. The chamber remains at a temperature of between about 500 and 550° C. and a pressure between about 11 and 70 Pa for a time between about 10 and 30 minutes The $N_2$ purge is believed to form a thin SiN layer on the Si. It is believed that the thin SiN formed on the α-Si surface and that the thin SiN layers (not shown) creates the mis-aligned grains and enhances boundary barrier.

Next, a second amorphous silicon layer 22 is deposited over the first amorphous silicon layer 20. It is an important feature that the silicon grain boundaries 28 of the first and the second amorphous silicon layer are mismatched 28. The mismatch occur because of the stop and starting of the flow of Si containing gas (e.g., $SiH_4$) gas, because of the $N_2$ purge and because of the temperature and Pressure differences in the different steps.

The second amorphous silicon layer is preferably grown at temperature between about 520 and 575° C. The second amorphous silicon layer preferably has a thickness in a range of between about 300 and 1000 Å. The second amorphous silicon layer is preferably undoped.

The 2nd amorphous layer is preferably deposited at the different conditions as the 1st α-Si layer. The different α-Si deposition temperatures change the grain size or some other properties. This enhances the grain mis-match and improves the invention. The first and second α-Si layers can be made from the same source gasses.

This insitu deposition and $N_2$ purge process (as described above for the $1^{st}$ and $2^{nd}$ layers) can be repeated to form two or more α-Si layers. Most preferably the reaction conditions (e.g., Dep Temperature) is varied between adjacent layers. Most preferably, 2 or more a-Si layers are formed. After the amorphous layers are deposited, the substrate is removed from the chamber of the reactor.

TABLE

1st embodiment - Summary of the process to form a gate of multiple α-Si layers -

| Step | Temperature range (C.°) | Other parameters | Pressure range (Torr) |
|---|---|---|---|
| form gate oxide 12 place wafer in silicon reactor; | | | |
| deposit 1st α-Si layer 20 using $SiH_4$ | 500 to 565 | | 11 Pa to 70 Pa |
| pump down poly reactor | | Time 5 to 30 min | 11 to 70 Pa |
| and back fill with $N_2$ | 500 to 530 | Time 5 to 30 min | 11 to 70 Pa |
| deposit 2nd α-Si layer 22 using $SiH_4$ continue α-Si depositions and purge to form the desired number of α-Si layers. remove wafer from silicon reactor patterning α-Si layers to form a gate I/I ions in the gate forming a Silicide layer over said 2nd α-Si layer. | 530 | | |
| annealing the 1st and 2nd α-Si layers | | Time 20 to 60 minutes | |

E. Second Embodiment—1̂ Deposit α-Si, 2̂ Etch α-Si, & 3̂ Deposit α-Si

In the second embodiment, between the deposition of the α-Si layers, the wafer is etched, for example in an HF vapor or wet clean. Then the wafer is returned to the chamber and another α-Si layer is formed thereover. The HF vapor etch is preferably not performed insitu in the poly reactor chamber.

The α-Si wafers can be wet cleaned in a liquid solution comprising DI water and HF.

The table below describes the preferred process for the second embodiment.

TABLE

2nd embodiment - Summary of the process to form a gate of multiple α-Si layers -

| | Temperature range (C.°) | Pressure range (Torr) | Other parameters |
|---|---|---|---|
| form gate oxide place wafer in Silicon reactor; deposit 1st α-Si layer using $SiH_4$ | 500 to 565 | 10 to 70 Pa | |
| etch the wafer using HF vapor or wet clean | | 50 to 150 | |
| deposit 2nd α-Si layer using $SiH_4$ continue α-Si depositions and etches to form the desired number of α-Si layers. patterning the α-Si layers to form a gate I/I ions in the gate forming a Silicide layer over said 2nd α-Si layer. | 500 to 565 | | |
| anneal the 1st and 2nd α-Si layers | | | time 10 to 60 minutes |

Figure 6:
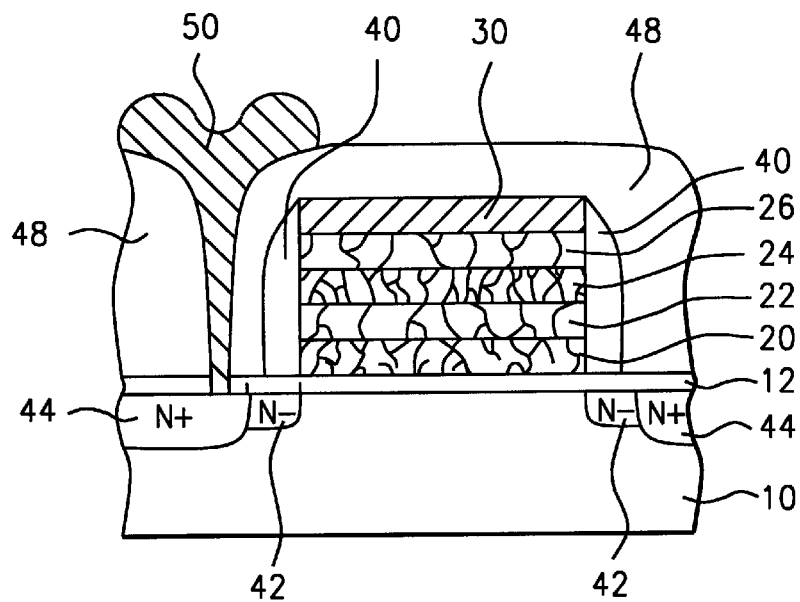
FIG. 6 is a cross sectional view for illustrating an example of a multi-layered α-Si gate of a semiconductor device according to the present invention.

F. Patterning the Amorphous Silicon Layers to Form a Multi-layered Amorphous Gate After the multi-layered α-Si layers are formed, the gate and FET is completed using conventional processing. Referring to FIG. 6, the amorphous silicon layers are patterned to form a multi-layered amorphous gate. The α-Si layers are patterned using a conventional photoresist layer and etch.

G. I/I Into Gate

Ions are implanted into the multi-layered amorphous gate 12 20 22 and into the substrate 10 to form Source/Drain regions 42 44. For PMOS devices, $B+/BF_2^+$ ions are implanted into the gate. P+ ions are implanted into the gate to when P+ S/D regions are formed in P-FET devices. Likewise N-MOS FETs can be formed by implanting N-type impurities into the Gate and into the substrate to form N-type source/drain regions.

Impurity ions (e.g., $BF_2$) are implanted into the semiconductor substrate to form source and drain regions (not shown). The multilayer polysilicon gate is used as a mask for the source and drain implantation. The mismatched grain boundaries of the gate will inhibit the B+ or $BF_2^+$ ions from penetrating through the gate to the underlying gate oxide during the next thermal cycle.

H. $WSi_x$ Layer 30

An optional metal silicide layer 30 can be formed over the amorphous silicon layers. A layer of tungsten silicide 30 is deposited overlying the topmost α-Si layer (e.g. 26). This layer may be composed of $WSi_x$, deposited by chemical vapor deposition to a thickness of between about 1250 to 2000 Angstroms, using $WF_6$ as a precursor. Conventional lithography and etching techniques are applied to pattern the gate structure, as shown in FIG. 6.

The F+ ions from the tungsten silicide deposition are inhibited by the mismatched grain boundaries of the multilayer gate from penetrating through the gate to the underlying gate oxide. The ions are confined to the layered structure.

I. Annealing the Amorphous Silicon Layers

Next, the amorphous silicon layers are annealed. The anneal can anneal both the S/D regions and the silicide anneal.

The anneal of the amorphous silicon layers performed at temperature in a range of between about 520 and 1000° C. and for a time in a range of between about 10 seconds and 20 minutes. The anneal converts the α-Si to polysilicon.

J. Completing the TX

The integrated circuit may be completed as is conventional in the art. For example, lightly doped regions 42 and sidewall spacers 40 may be formed, typically before the source and drain implantation 44. An insulating layer 48 of borophosphosilicate glass or the like may be deposited over the semiconductor device structures. Contact openings may be made and a metal or conductive polysilicon layer 50 may be deposited and patterned to form a contact.

FIG. 6 illustrates an N channel MOSFET integrated circuit device. Please note that the gate can be composed of two or more α-Si layers 20 22 24 26 and is not limited to the 4 α-Si layer structure shown in FIG. 6. Also the silicide layer 30 is optional. It is well understood by those in the art that a P channel FET integrated circuit device could be formed by simply substituting opposite polarities to those given for the N channel embodiment. Also, in a similar way, a CMOSFET could be formed by making both N channel and P channel devices upon the same substrate.

The inventor's have found that the $1^{st}$ and $2^{nd}$ embodiments for forming mismatched grain boundaries work better than the prior art processes (e.g., changing deposition temperatures).

While the invention has been particularly shown and described with reference to the preferred embodiments thereof, it will be understood by those skilled in the art that various changes in form and details may be made without departing from the spirit and scope of the invention.

What is claimed is:

1. A method of fabricating a multi-layered amorphous silicon gate of a semiconductor device; providing a gate dielectric layer over a substrate; placing said substrate in a chamber of a reactor; the method comprising the following steps:
   a) forming a first amorphous silicon layer over said gate dielectric layer;
   b) flushing said chamber with an inert gas to remove said Si containing gas;
   c) depositing a second amorphous silicon layer over said first amorphous silicon layer; wherein said silicon grain boundaries of said first and said second amorphous silicon layer are mismatched;
   d) removing said substrate from said chamber; whereby the mismatched silicon grain boundaries inhibit the penetration of ions into said gate silicon oxide layer underlying said gate.

2. The method of claim 1 which further includes:
   a) repeating steps (a) and (b) to form three or more amorphous silicon layers having mis-matched grain boundaries;
   b) patterning said amorphous silicon layers to form a multi-layered amorphous gate;
   c) Implanting ions into said multi-layered amorphous gate and into said substrate to from Source/Drain regions;
   d) forming a metal silicide layer over said amorphous silicon layers;
   e) annealing said amorphous silicon layers.

3. The method of claim 1 which further includes:
   a) repeating steps (a) and (b) to form three or more amorphous silicon layers having mis-matched grain boundaries;
   b) patterning said amorphous silicon layers to form a multi-layered amorphous gate;
   c) Implanting ions into said multi-layered amorphous gate and into said substrate to from Source/Drain regions;
   d) forming a metal silicide layer over said amorphous silicon layers;
   e) annealing said amorphous silicon layers; the anneal of said amorphous silicon layers performed at temperature in a range of between about 500 and 1000° C. and for a time in a range of between about 10 sec and 60 minutes.

4. The method of claim 1 wherein said first amorphous silicon layer is grown at temperature between about 500 and 570° C. using a Si containing gas; said first amorphous silicon layer having a thickness in a range of between about 500 and 1500 Å; said first amorphous silicon layer is undoped.

5. The method of claim 1 wherein the flushing performed for a time between about 5 and 60 minutes; Said chamber at a temperature between about 500 and 570° C.

6. The method of claim 1 wherein said second amorphous silicon layer is grown at temperature between about 500 and 570° C.; said second amorphous silicon layer having a thickness in a range of between about 500 and 1500 Å; said second amorphous silicon layer is undoped.

7. A method of fabricating a multi-layered amorphous silicon gate of a semiconductor device; comprised of:
   a) forming a gate dielectric layer over a substrate;
   b) placing said substrate in a chamber of a reactor and sequentially performing the following steps:
   c) forming a first amorphous silicon layer over said gate dielectric layer;
      (1) said first amorphous silicon layer is grown at temperature between about 500 and 570° C. using a Si containing gas; said first amorphous silicon layer having a thickness in a range of between about 500 and 1500 Å; said first amorphous silicon layer is undoped;
   d) flushing said chamber with an inert gas to remove said Si containing gas;
      (1) the flushing performed for a time between about 5 and 60 minutes; Said chamber at a temperature between about 500 and 570° C;
   e) depositing a second amorphous silicon layer over said first amorphous silicon layer; wherein said silicon grain boundaries of said first and said second amorphous silicon layer are mismatched;
      (1) said second amorphous silicon layer is grown at temperature between about 500 and 570° C.; said second amorphous silicon layer having a thickness in a range of between about 500 and 1500 Å; said second amorphous silicon layer is undoped;
   f) removing said substrate from said chamber.

8. The method of claim 7 wherein repeating steps (a) and (b) to form three or more amorphous silicon layers having mis-matched grain boundaries.

9. A method of fabricating a multi-layered amorphous silicon gate of a semiconductor device; comprised of:
   a) forming a gate dielectric layer over a substrate;
   b) forming a first amorphous silicon layer over said gate dielectric layer;

c) etching said first amorphous silicon layer;

d) depositing a second amorphous silicon layer over the etched surface of said first amorphous silicon layer; wherein said silicon grain boundaries of said first and said second amorphous silicon layer are mismatched; e) patterning said amorphous silicon layers to form a multi-layered amorphous gate.

10. The method of claim 9 further includes forming a metal silicide layer over said amorphous silicon layers;

a) Implanting ions into said multi-layered amorphous gate and into said substrate to from Source/Drain regions;

b) annealing said amorphous silicon layers;

c) implanting impurity ions into said first and second amorphous silicon layers.

11. The method of claim 9 wherein said first amorphous silicon layer is grown at temperature between about 500 and 570; said first amorphous silicon layer having a thickness in a range of between about 500 and 1500 Å; said first amorphous silicon layer is undoped.

12. The method of claim 9 wherein the etch of said amorphous silicon layer performed using a HF vapor or HF wet etch.

13. The method of claim 9 wherein said second amorphous silicon layer is grown at temperature between about 500 and 570° C.; said second amorphous silicon layer having a thickness in a range of between about 500 and 1500 Å; said second amorphous silicon layer is undoped.

14. The method of claim 10 wherein the anneal of said amorphous silicon layers performed at temperature in a range of between about 500 and 1000° C. and for a time in a range of between about 10 seconds and 60 minutes.

15. A method of fabricating a multi-layered amorphous silicon gate of a semiconductor device; comprising:

a) forming a gate dielectric layer over a substrate;

b) forming a first amorphous silicon layer over said gate dielectric layer;
      (1) said first amorphous silicon layer is grown at temperature between about 500 and 570; said first amorphous silicon layer having a thickness in a range of between about 500 and 1500 Å; said first amorphous silicon layer is undoped;

c) etching said first amorphous silicon layer; the etch of said amorphous silicon layer performed using a HF vapor or a HF wet etch;

d) depositing a second amorphous silicon layer over the etched surface of said first amorphous silicon layer; wherein said silicon grain boundaries of said first and said second amorphous silicon layer are mismatched;
      (1) said second amorphous silicon layer is grown at temperature between about 500 and 570° C.; said second amorphous silicon layer having a thickness in a range of between about 500 and 1500 Å; said second amorphous silicon layer is undoped;

e) patterning said amorphous silicon layers to form a multi-layered amorphous gate;

f) forming a metal silicide layer over said amorphous silicon layers;

g) Implanting ions into said multi-layered amorphous gate and into said substrate to from Source/Drain regions;

h) annealing said amorphous silicon layers;
      (1) the anneal of said amorphous silicon layers performed at temperature in a range of between about 500 and 1000° C. and for a time in a range of between about 10 seconds and 60 minutes;

i) implanting impurity ions into said first and second amorphous silicon layers.

* * * * *